United States Patent [19]

Stopper et al.

[11] Patent Number: 4,847,732
[45] Date of Patent: Jul. 11, 1989

[54] WAFER AND METHOD OF MAKING SAME

[75] Inventors: Herbert Stopper, Orchard Lake; Cornelius C. Perkins, Brimingham, both of Mich.

[73] Assignee: Mosaic Systems, Inc., Troy, Mich.

[21] Appl. No.: 204,997

[22] Filed: Jun. 8, 1988

Related U.S. Application Data

[63] Continuation of Ser. No. 581,976, Feb. 21, 1984, abandoned, and a continuation-in-part of Ser. No. 532,391, Sep. 15, 1983, abandoned.

[51] Int. Cl.⁴ .............................................. H05K 1/14
[52] U.S. Cl. .................................... 361/395; 361/414; 357/2; 357/6
[58] Field of Search ............... 361/395, 403, 414, 271; 357/2, 6, 67, 59 F, 74

[56] References Cited

U.S. PATENT DOCUMENTS

| | | | |
|---|---|---|---|
| 3,699,543 | 10/1972 | Neale | 357/2 X |
| 3,781,683 | 12/1973 | Freed | 324/158 F |
| 3,983,479 | 9/1976 | Lee et al. | 324/158 R |
| 4,021,838 | 5/1977 | Warwick | 357/68 |
| 4,047,132 | 9/1977 | Krajiwski | 361/414 |
| 4,074,342 | 2/1978 | Honn et al. | 361/411 |
| 4,115,872 | 9/1978 | Bluhm | 357/2 |
| 4,146,902 | 3/1979 | Tanimoto et al. | 357/6 |
| 4,174,521 | 11/1979 | Neale | 357/67 X |
| 4,177,475 | 12/1979 | Holmberg | 357/2 |
| 4,257,061 | 3/1981 | Chapel, Jr. et al. | 357/69 |
| 4,366,614 | 1/1983 | Kumurdjian | 29/580 |
| 4,420,766 | 12/1983 | Kasten | 357/59 F |
| 4,433,342 | 2/1984 | Patel et al. | 357/2 |
| 4,441,249 | 4/1984 | Alspecter et al. | 29/577 C |
| 4,453,176 | 6/1985 | Chance et al. | 357/51 |
| 4,458,297 | 7/1984 | Stopper et al. | 361/403 |
| 4,467,400 | 8/1984 | Stopper | 361/403 |
| 4,471,374 | 9/1984 | Hardee et al. | 357/59 |
| 4,471,376 | 9/1984 | Morcom et al. | 357/71 |
| 4,479,088 | 10/1984 | Stopper | 324/73 R |
| 4,481,283 | 11/1984 | Kerr et al. | 430/319 |
| 4,484,215 | 11/1984 | Pappas | 357/80 |

FOREIGN PATENT DOCUMENTS 0114228 1/1984 European Pat. Off. .

OTHER PUBLICATIONS

IBM, Technical Disclosure, vol. 22, No. 8A, Jan. 1980.
Hallas et al., Test Structure for Semiconductor Chips *IBM Technical Disclosure Bulletin*, vol. 19, No. 3, Aug. 1976.
Ghatalia et al., Semiconductor Process Defect Monitor, *IBM Technical Disclosure Bulletin*, vol. 17, No. 9, Feb. 1975.
Pluggable-Module Power-Connection Mechanism *IBM Technical Disclosure Bulletin*, vol. 27, No. 10A, Mar. 1985.
Archey et al., Integrated Magnetic Memory Structure, *IBM Technical Disclosure Bulletin*, vol. 14, No. 7, Dec. 1971.
Thick Film Integrated Decoupling Capacitor With Redundancy, *IBM Technical Disclosure Bulletin*, vol. 27, No. 11, Apr. 1985.
Davidson et al., Capacitor For Multichip Modules, *IBM Technical Disclosure Bulletin*, vol. 20, No. 8, Jan. 1978.
Bodendorf et al., *Active Silicon Chip Carrier*, IBM Technical Disclosure Bulletin, vol. 15, No. 2, Jul. 1972, pp. 656–657.
Article entitled "Thermal-Conduction Module Cradles and Cools Up to 133 LSI Chips", by D. R. Barbour, O. Oktay and R. A. Rinne, Electronics, Jun. 16, 1982, pp. 143–146.
Article entitled "Amorphous Vias in Wafer Link Chips", from Electronics, Sep. 22, 1983, pp. 48 and 49.

*Primary Examiner*—Todd E. Deboer
*Attorney, Agent, or Firm*—Harness, Dickey & Pierce

[57] ABSTRACT

Disclosed is a wafer substrate for integrated circuits 1 which by itself may be made either of conductive or non-conductive material. This substrate carries two planes or layers of patterned metal 19,20, thus providing two principal levels of interconnection. A programmable amorphous silicon insulation layer 21 is placed between the metal layers. There are sheet lower metal layers with an insulator which permit power distribution across the wafer. Connections between the metal layers or between the metal layer and the substrate can be made through via holes in the insulator layers or layers, respectively. Pedestals are provided for bonding.

16 Claims, 12 Drawing Sheets

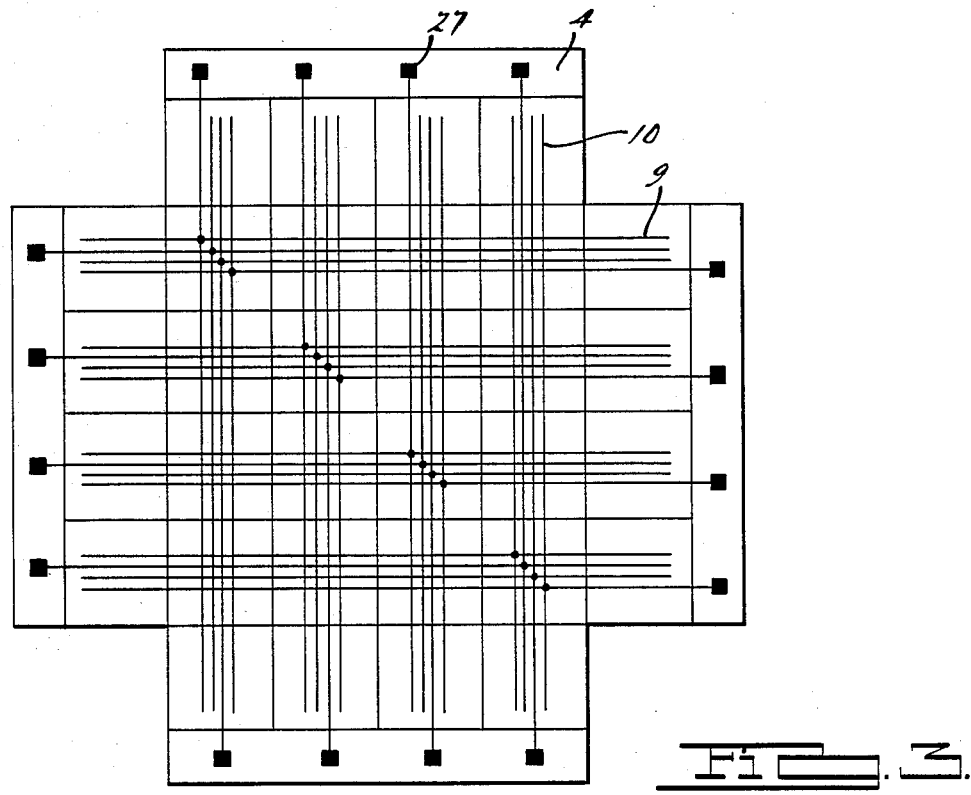
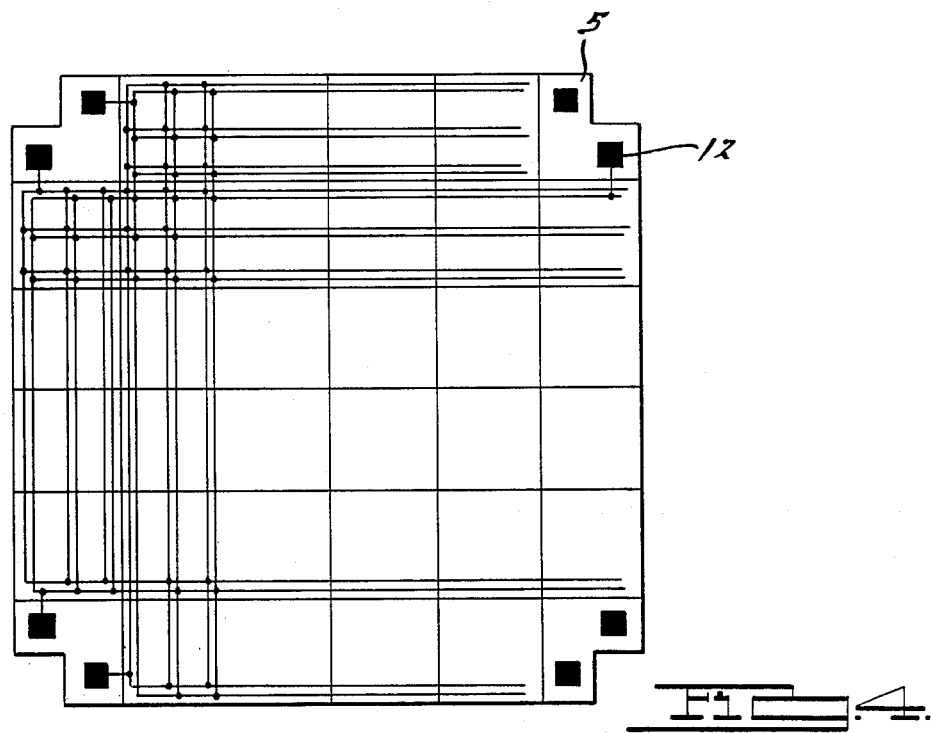

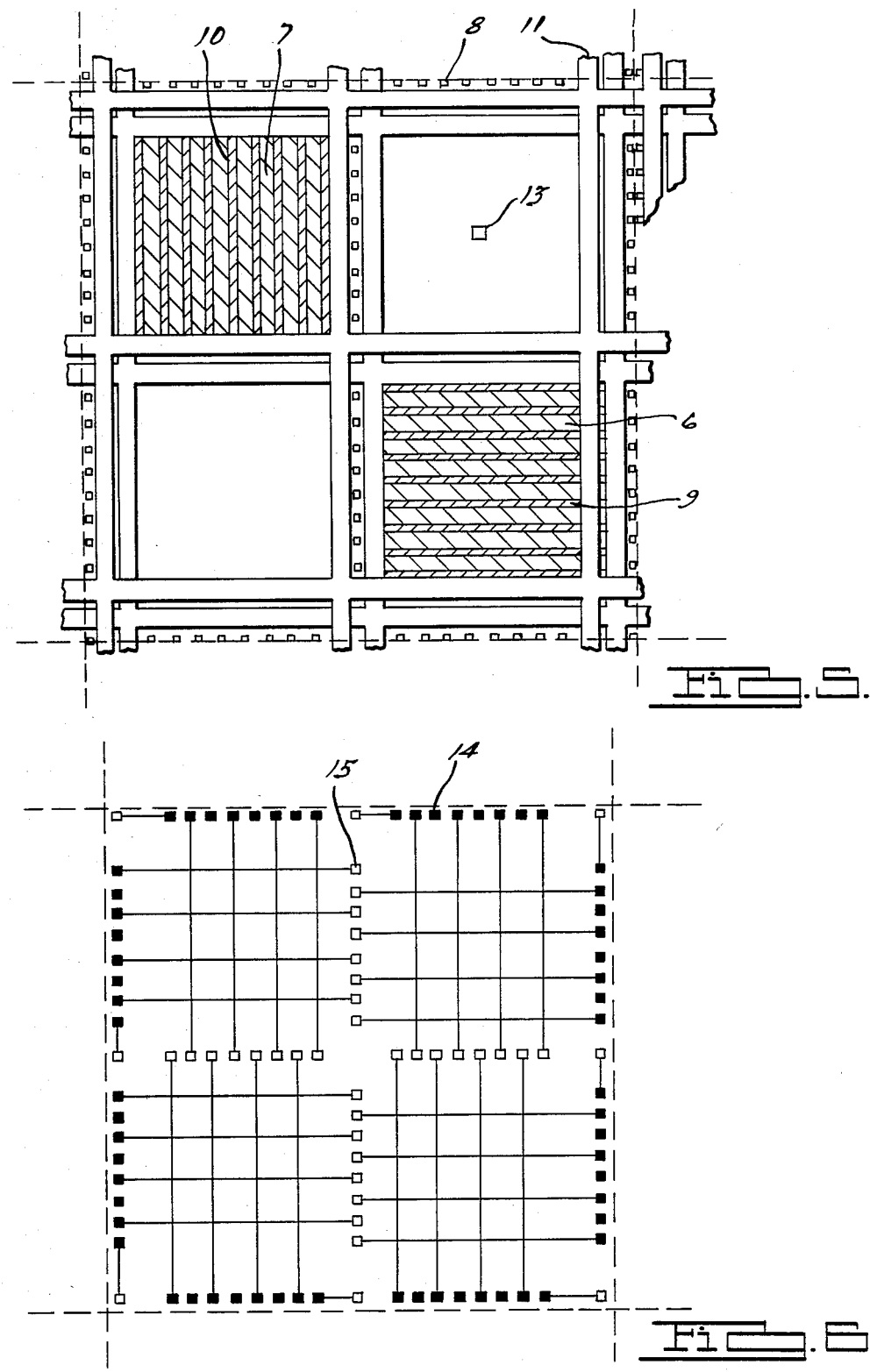

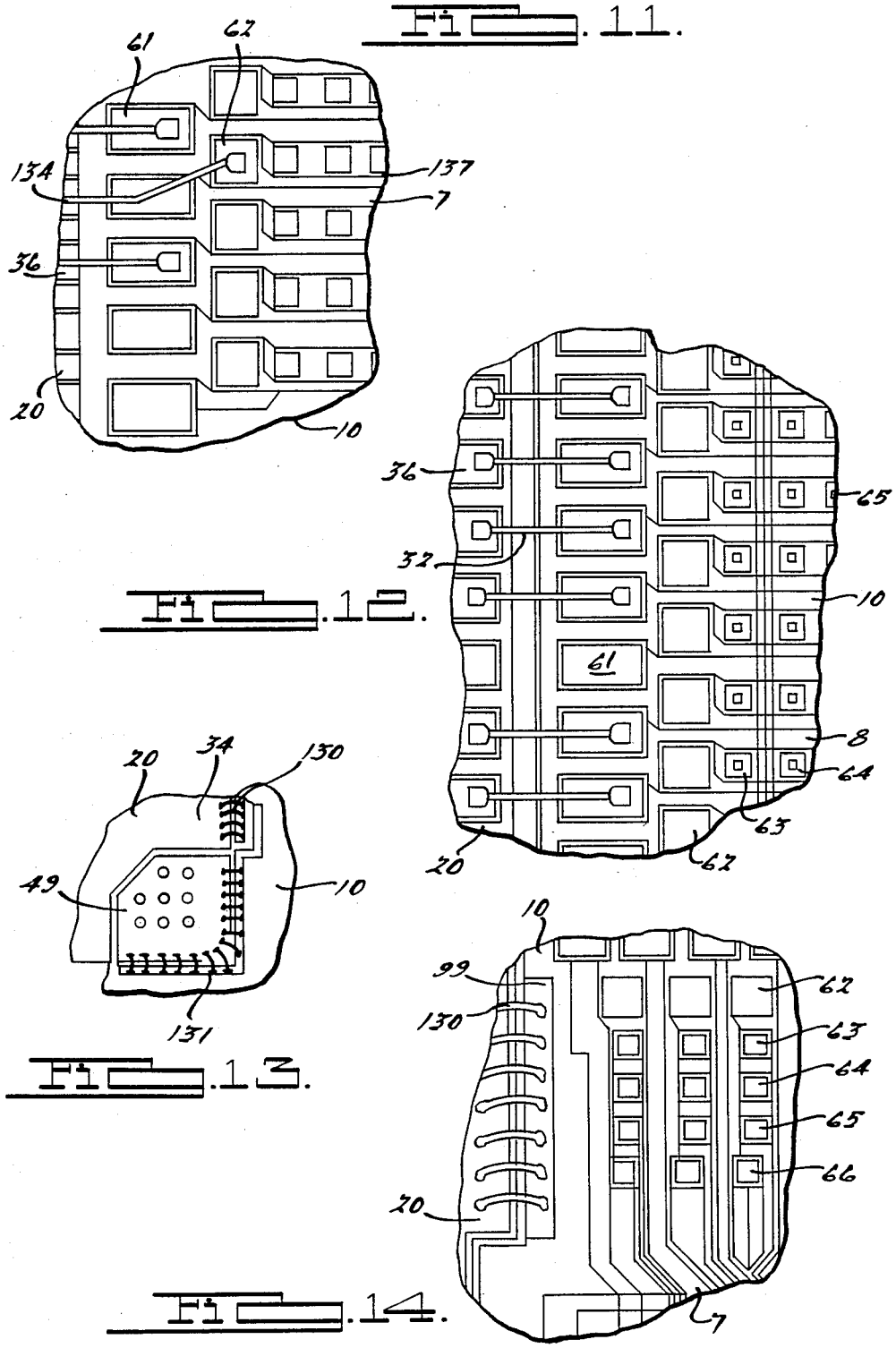

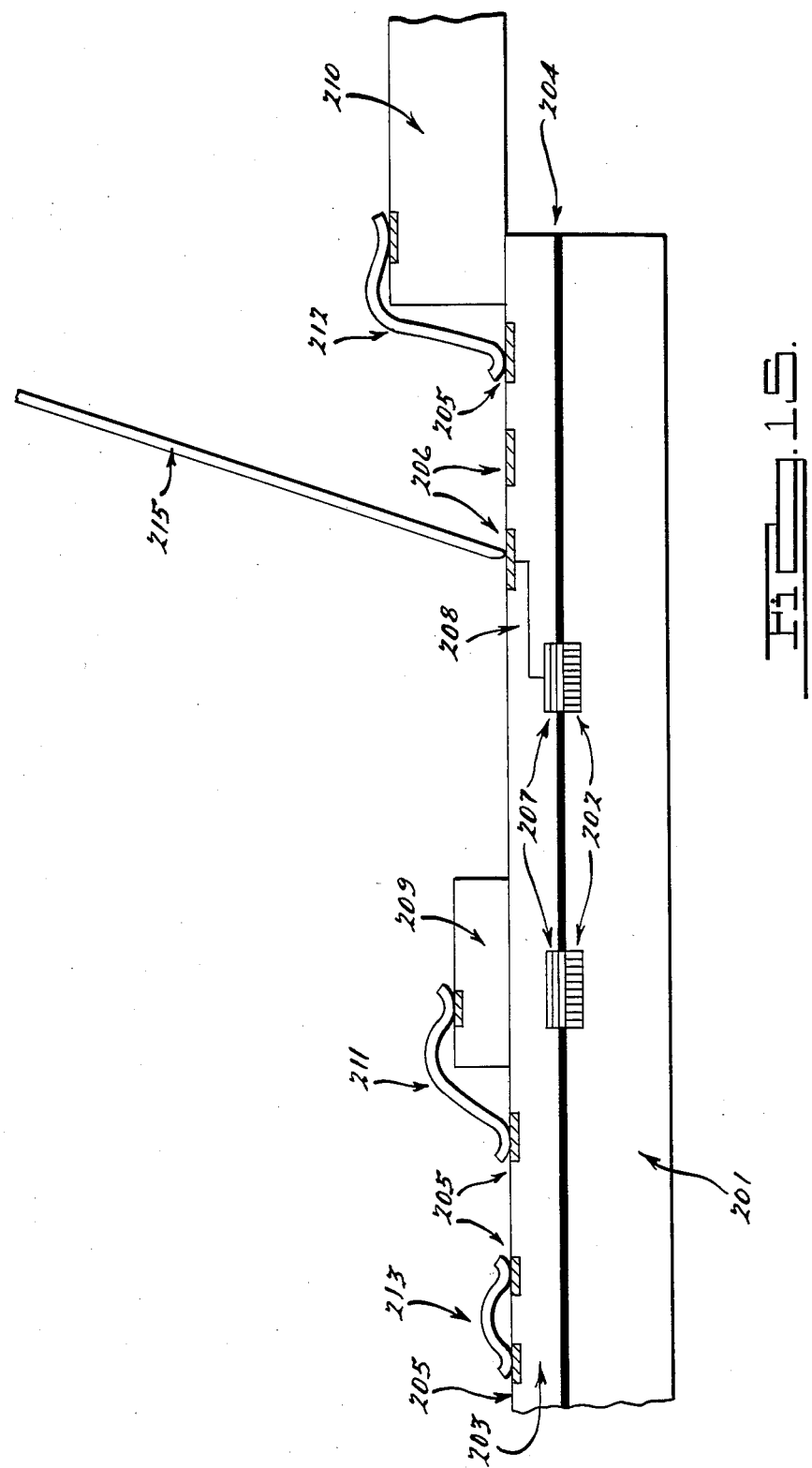

WAFER AND METHOD OF MAKING SAME

RELATED APPLICATIONS

This is a continuation of U.S. patent application Ser. No. 581,976 filed Feb. 21, 1984, now abandoned, which is a continuation-in-part of U.S. Ser. No. 532,391 filed Sept. 15, 1983 entitled Wafer and Method of Making the Same, now abandoned.

BACKGROUND OF THE INVENTION

The invention and discoveries disclosed herein relate to wafer scale integration. In bringing wafer scale devices and complete systems made thereon into commercial reality we have discovered ways to make substantial improvements.

The "chip" is a basis of many of today's advanced computer and electronic devices. However, even as the size of the chip has grown from its original integrated circuit, to a large scale integrated circuit, to a very large scale integrated circuit, these chips have always been manufactured on wafers as an intermediary step in the manufacturing process. The wafer when manufactured is made with many usually identical circuits located in dies spread out across the surface of the wafer. Thereafter these circuits are diced and the individual die become what is referenced to as chips. The reason for dicing is in part based upon the experience that only a few of the circuits which have been built on a wafer end up being good. We think that, until now, pinholes and dust particles have been one of the major problems causing faulty circuits. Pinholes destroy the fine circuit pattern from the mask. In order to get good circuits, the circuits are tested on the wafer then diced and sorted for the individual good chips and then packaged. Often the final high speed tests are only performed after the chip is in its package.

In contrast to this present state of the art, applicants and others had been working on a level of technology which is called "wafer scale integration". This technology utilizes the entire wafer to make a system package, as opposed to a chip package. To understand the technology, gates, diodes, resistors and other well known electrical elements are fundamental units of a circuit, and a circuit is in turn an sub-element of a die, and a die or chip is a sub-element of a wafer. The wafer itself in our version of a monolithic wafer is composed of a plurality of circuits capable of being an entire system or a major subcomponent thereof. This system is of a scale much greater than the systems made on the single chips for the first time approximately a decade ago. Since that time, chips during the last decade have been which have onboard memory, and instruction processors and an interconnection bus to the outside world.

By utilizing available VLSI technology and certain wafer scale integration techniques, dicing techniques can be eliminated. In the past we have made wafer scale devices as disclosed in U.S. Ser. No. 225,581 filed Jan. 16, 1981, which has been abandoned, and its continuation Ser. No. 445,156 filed Nov. 29, 1982, entitled Universal Interconnection Substrate, invented by Stopper et al now U.S. Pat. No. 4,458,297. One of the advantages of this prior art device is that it features electrical programming of chip interconnections. In a nutshell, that means the elimination of the need for custom work or wiring scheme to hook up randomly occurring good chips on each wafer. It is a hybrid technique.

In contrast thereto, personnel at Trilogy have been fabricating ECL circuits in pursuance of the concept of the computer on a chip or wafer. They had expected to package these devices in the year 1984, and the Trilogy approach is different from our approach. Trilogy has announced that they have had substantial technical difficulties and have been unable to prove their technology.

Trilogy has planned on dicing its wafer into larger chips between one inch and two inches square, and packaging those in hermetically sealed, water cooled modules. We are informed that Trilogy has opted to use bumped wafers with area bonding tape. The area bonding tape contacts the wafer bonding pads into a pin grid array with signal lines only on the tape. Power and ground are on a separate distribution network exiting the wafer module on a bus. Trilogy has been utilizing ECL circuits which translate into heat. In dealing with this the use of amorphous calcoginide, the two-way programmable fuse. In *Electronics*, Sept. 22, 1983, it was reported that our further experimental work utilizes an amorphous "antifuse", which technology employs amorphous silicon. Amorphous, or non-crystalline silicon, serves as an insulator sandwich between two layers of metal on our wafer. Like the prior application, metal lines are laid down in a reticulate array on one or more layers at right angles to another or orthogonally to lines in another layer to permit us to form a programmable via to connect crossing lines.

Because of this connection, a fusing interconnection is caused between the two conductors to connect two lines of a reticulate array together and to permit us to connect chips.

The prior Universal Interconnection Substrate application had means which limited its purposes and this application is directed to an electrically programmable silicon interconnect substrate which can be configured for not only ECL, but also TTL and/or C-MOS or other logic technologies so that, if a hybrid technology is utilized the final array of chips can become a total system on a wafer utilizing various chip technologies. In addition, we have been able to overcome many problems and make the wafer from 100 mm wafers. In a hybrid system, each chip will be bonded to the silicon substrate with epoxy and aluminum wedge or wire bonding. The entire substrate is mounted into a core assembly or module which permits not only air cooled units, but also liquid freon or liquid nitrogen cooling.

The discoveries and inventions we have made in order to accomplish versatile wafer scale systems may be used not only in connection with prior U.S. Pat. No. 4,458,297 previously referenced and incorporated herein fully by reference, but also in systems as disclosed in application U.S. Ser. No. 360,177, filed Mar. 22, 1982 now abandoned, entitled Computer Apparatus and Method, invented by Stopper et al, and also disclosed the above referenced related applications all of which are incorporated fully by reference. A result of the discoveries and inventions we have made will be to permit the assembly of electronics which are faster, smaller and more energy effective and reliable than previous technology. The advantage of the device permits it to utilize TTL circuits, ECL, and/or C-MOS logic with no significant pin out restraint on the integrated circuits themselves. The disclosed wafer system may be 100 mm and permits operation at cold temperatures permitting C-MOS to operate faster. High powered C-MOS devices can achieve bipolar speeds. It is expected that the C-MOS devices will exceed bipolar speeds in the future and our device permits the utilization of C-MOS chips to permit maximum gate counts. The utilization of field programmable interconnection substrates eliminates turnaround and eliminates many masking steps utilized in existing technology and eliminates much of the high capital costs needed for the wafer scale approaches employed by Trilogy. Our improvements permit any available heat sink, such as cool liquid, to be an environment, permitting air or direct immersion liquid cooling to be used with the wafer system. Many technical improvements have been made which have no prior art. The technical improvements are described in the detailed description of the invention and are included in the claims appended hereto.

FIG. 3 is a plan view of the layer portion of the wafer of FIG. 1 showing netlines.

FIG. 4 shows the layer portion of FIG. 1 for power distribution, in an alternate embodiment.

FIG. 5 shows a cell (2 in FIG. 1) in more detail.

FIG. 6 shows a layer of the cell of FIG. 5 showing bonding pads in detail.

FIG. 11 shows a microscopic view like FIG. 10, showing a header edge showing alternate bonding.

FIG. 12 is a view like FIG. 11 showing primary bonding.

FIG. 13 shows a corner of the header and wafer.

FIG. 14 shows a closer view of the top portion of FIG. 13.

FIG. 15 shows a sectional schematic of a wafer formed with discrete die which are interconnected with a hybrid die to form a system.

DETAILED DESCRIPTION OF THE PREFERRED EMBODIMENTS AND PROCESS OF MANUFACTURE OF THE WAFER SYSTEM

Figure 1:
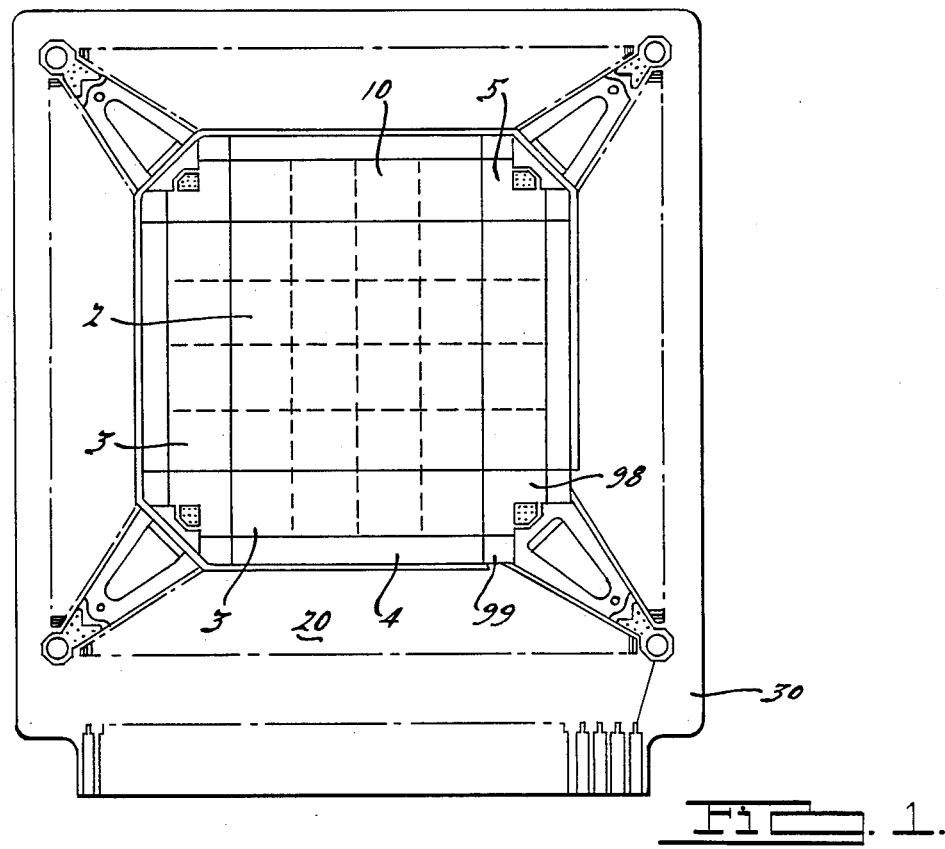
FIG. 1 shows a wafer scale device of which layers will be shown.

FIG. 1, like prior application Ser. No. 445,156 which is a continuation of Ser. No. 225,581 which is prior art, is a plan view of a wafer 1 showing how the available area may be divided into inner cells 3, outer cells 13, logic line hookup areas 74 and power hookup areas 71.

Figure 2:
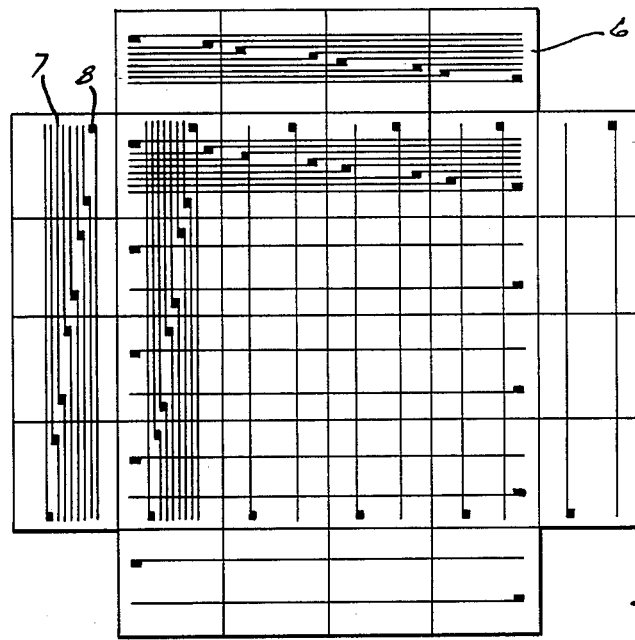
FIG. 2 is a plan view of the layer portions of the wafer of FIG. 1, showing padlines.

FIG. 2 shows horizontal padlines 6 and vertical padlines 7 crossing a number of cells in such a way that each pad 8 can be connected to its own padline. Outer cells are crossed by either horizontal or vertical padlines. Inner cells are crossed by both horizontal and vertical padlines. These lines can be under (or over) the cells and/or between discrete die.

FIG. 3 shows horizontal netlines 9 and vertical netlines 10 which cross all cells in such a way that each horizontal padline 6 is crossed by each vertical netline 10 and each vertical padline 7 by each horizontal netline 9. Each horizontal netline 9 is connected permanently to exactly one vertical netline 10 and to exactly one contact pad 27 in one of the hookup areas 74. Thus, all padlines cross all nets and all nets can be externally accessed.

FIG. 4 shows a power grid 11 system which can be used in combination with the pad and netlines. We have substantially improved over this prior art system which provides for a two rail power distribution system as we will describe below. In a rail system, each cell is crossed by both rails three times in both the horizontal and vertical directions. The power rails are connected to a pair of contact pads 12 in each power hookup area 5.

FIG. 5 shows an inner cell with some more detail. Power grid 11 bonding pads 8, padlines 6 and 7, and netlines 9 and 10 share the available space in such a way that interconnect and power and metal planes are provided.

FIG. 6 shows that a cell contains main bonding pads 14 and auxiliary bonding pads 15. Only main pads command their own pad lines as shown in FIG. 2. An auxiliary pad is connected to a next neighbor main pad.

Figure 7:
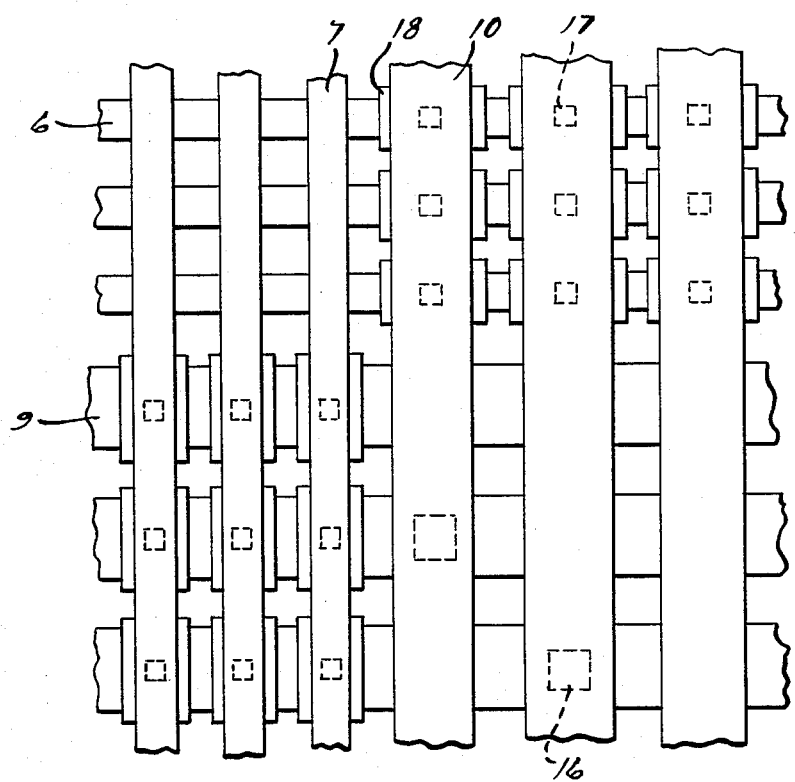
FIG. 7 is a further detail of FIG. 5.

FIG. 7 shows a detail 13 as it may be found in FIG. 5. The narrow lines are padlines 6 and 7, and the wide lines are netlines 9 and 10. Cross-overs between padlines are insulated. Cross-overs between netlines are generally also insulated except that each horizontal netline is connected through a via hole 16 at one point to a vertical netline. Cross-overs between padlines and netlines have a via hole 17 cut into the insulator between the metal layers and have a pad or layer of amorphous semiconductor 18 sandwiched between.

Figure 8:
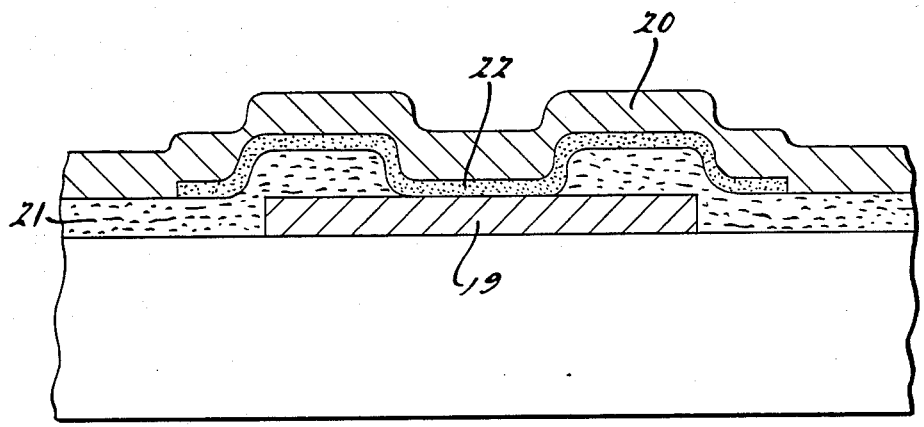
FIG. 8 shows a cross section of FIG. 5 through a cross-over between a padline and a netline.

FIG. 8 shows a cross section through a cross-over between a padline and a netline. Lower level metal 19 is generally separated from upper level metal 20 by the insulator 21 except for the via hole within the insulation where the metals are separated from each other by the amorphous semiconductor material 22.

Figure 9:
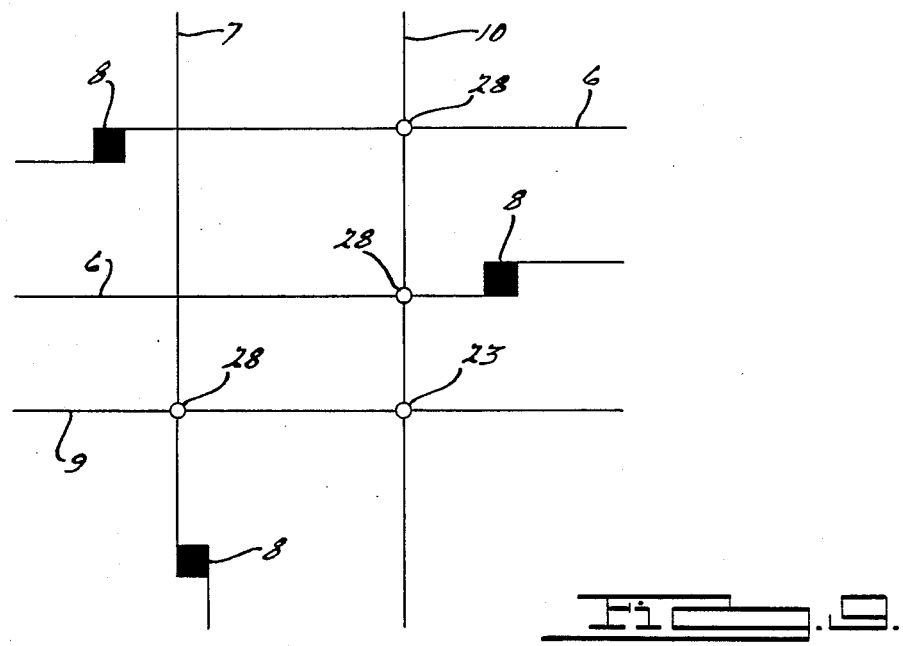
FIG. 9 is a diagrammatic view of an interconnection between the pads.

FIG. 9 shows how the desired interconnection between three pads 8 is made by selecting two orthogonal netlines 9 and 10 which are permanently connected to each other by via hole 23 and by firing the controllable cross-points 28 between the applicable padlines 6 and 7 and the chosen net.

From the above, it will be seen that the drawings 1–9 taken in part from prior art application U.S. Ser. No. 225,581, filed January 16, 1981, disclose a substrate 1 which by itself may be made either of conductive or non-conductive material. This substrate carries two planes or layers of patterned metal 19, 20, thus providing two principal levels of interconnection. An insulation layer 21 is placed between the metal layers and also between the lower metal layer and the substrate if the latter is conductive. Connections between the metal layers or between the metal layer and the substrate can be made through via holes in the insulator layer or layers, respectively. The padlines and netlines of this prior application are employed in our improved system, and substantial improvements have been made, a description of which follows.

The real estate for a hybrid system as provided by the substrate is divided into special areas used for inner cells, outer cells, signal hookup areas, and power hookup areas. In one preferred embodiment, the substrate may be a disk with a diameter of 100 mm, the cells may be square areas, the signal hookup areas may be along the edges of the wafer and the power hookup areas may be provided in the space at the "corners".

The cells are intended to host the integrated circuit chips and to provide the bonding pads for the signal connections between the chips and the substrate.

In FIG. 1 the wafer is shown with its face up. From this prior discussion, which may in combination be used with our new discoveries and improvements, it will be possible now to turn to a detailed description of our new discoveries and inventions.

Figure 10:
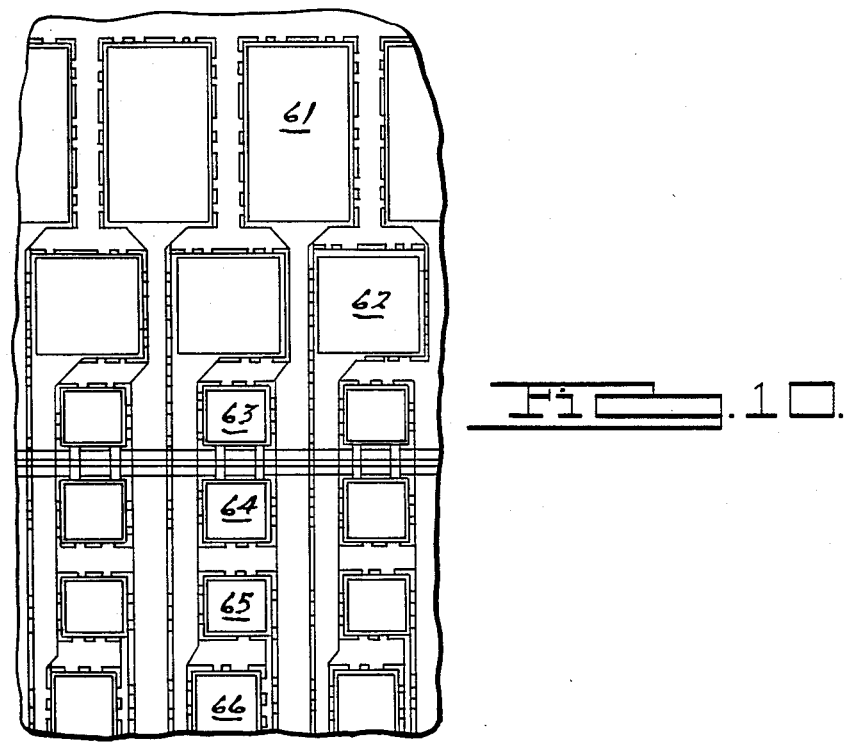
FIG. 10 is a detail of the signal line hookup area.

Each wafer has a connection rim of a wafer 1 as shown in FIG. 1. The rim structure area 74 is shown in part in an enlarged sized view FIG. 10 and also shown in details in FIGS. 11 and 14. In FIG. 10 is shown a design portion of the rim 74 of FIG. 1 in which 61 is a primary bonding pad and 62 is a secondary bonding pad which is used for an alternate bonding site in the event there is something wrong with the intended netline 7 or 8 attachment at the primary pad 61 and it is needed to have an external signal at that particular point on the header. We have additionally provided two test points 63 and 64 in the wafer connection rim for determining how an anti-fuse is programmed. The area of the rim functions as test points to validate the wafer before we proceed any further after fabrication. Probe or bonding points 65 and 66 are additional probe points to check the continuity of the netline 7 or 8 segments, so that one can get on one end, for example at a primary pad 61, and test whether that point can be connected on one other side of the wafer at a probe point 65 on that other side of the wafer. By probing the two points we can verify that the line segment 7 or 8 extending from pad 61 on one side to a test pad 65 on the other is in fact connected with no openings. FIGS. 11 and 14 show bonding at various points at the edge of the wafer to the header. Seen in FIG. 13 is a corner which has a ground bonding area 49 to the ground plane and a voltage bond site 34 both of which use a plurality of voltage and ground bond wires 130 and 131. FIG. 12 shows the number of signal bond wires going from the primary pads directly over to the cross-bonding position 36 on the header. FIG. 11 also shows an alternate bond wire 134 connecting from a secondary pad 67 to the corresponding position 36 on the header. This is the connection that is used in the event that there is a problem with the netline 7 associated with the primary bonding pad site. We can go to an alternate one to pick up an adjacent redundant netline 137.

The FIG. 14 shows how multiple connections need to be made from the ground point (like the voltage connect point) on the rim 74 from the power point 99 on the rim 44 to the voltage portion 34 on the header. Similarly, the multiple bonds would be made from a similar ground point connection on the rim to the ground point 49 on the patterned surface of the wafer which is connected then to the ground top of external connections.

FIG. 15 is a single drawing illustrating the preferred wafer embodiment of our invention as disclosed in patent application U.S. Ser. No. 532,391 now abandoned.

The details of FIG. 15 can be understood by those skilled in the art who know that a wafer is usually a very thin cylinder of silicon on which die are deposited. FIG. 15 represents a cross section of that silicon wafer and of the other items we use and which we shall describe.

In application U.S. Ser. No. 225,581 continued as U.S. Ser. No. 445,156 incorporated herein by reference, there was disclosed a wafer substrate for integrated circuits which by itself may be made either of conductive or non-conductive material. This substrate, in the present invention, references the base monolithic wafer. This substrate carries two planes or layers of patterned metal, thus providing two layers of interconnection. This patterned metal is considered to be an interconnection system within the meaning of this application. In the prior application, as now known from that application, the metal layers can have connections which are formed by amorphous semiconductor material. This, is by way of an amorphous via, as described therein. Connections between the metal layers or between the metal layers and the substrate can be made through via holes in the insulation layer between metals or between layers respectively. In this prior application, and in the presently described embodiment, the real estate of the wafer is divided into special areas called cells and signal hookup areas and power hookup areas are provided. In the prior application, it was disclosed that the cells were intended to host integrated circuit chips in a hybrid system of chips and metal layers with the interconnections providing signal connections between the chips on the surface.

Unlike the prior application, this embodiment utilizes a different substrate. The preferred substrate has been replaced by a silicon wafer 201 (corresponding to 10) with active die incorporated on it, which die are isolated one from the other, and which each have die contact sites 202 normally used for probing during testing and for bonding during packaging. To the wafer 201, and on the upper die carrying surface, has been layered a thin adhesive layer of polymide resin insulation layer 204. This resin, during the process of manufacturing the monolithic wafer, is cured and then etched to provide holes through the surface of the wafer to the die contact sites 202 so that these are covered temporarily. The resin performs the principal task of smoothing the surface of the wafer, which is important to subsequent processing and improves step coverage. Thereafter during the process of manufacture of the monolithic wafer a thin film interconnection system 203, of which the prior interconnection system which has been incorporated by reference as a preferred example, is deposited on the insulation layer 204.

The interconnection system 203 has incorporated therein its own contact sites. On the upper surface are bond contact sites 205, situated at sites suitable for wire bonding. There are probe contact sites 206 suitable for probing with a test probe 215, and there are coupling contact sites 207 suitable for coupling of the interconnection system to the underlying die at die contact site 202. While in general any contact site may be coupled to any contact site, there is a special direct connection 208 between the probe contact sites 206 and the coupling contact sites 207 for the purpose of making direct test access to the buried contact site of 207 and coupled die contact site 202.

One should note here that wafers with isolated die formed thereon are common techniques in the intermediate process of making circuits. The wafer of the preferred embodiment is made like these wafers. The interconnection system which has been described, is programmable in the manner generally taught by the aforementioned prior application so that interconnection can be made for signal purposes throughout any or all of the dies on the wafer, which previously had been isolated. The underlying die can be a plurality of 64K or 256KRAM die, and these can be unified into a mass memory.

These die can be unified into a full system, which can include instruction processor chips, I/O interfaces, and many other chips which are required to make a full system. The die can be replaced, if not in working order or unwanted, by a substitute die. The additional chips can be used to make a full system or the substitute die can be placed over the die on the wafer by adhesively bonding the downbond hybrid chips 207 carrying the desired circuits where they are placed on the surface on the interconnection system 203. Then a wire bond 211 is made to selected bonding sites, as from a site on the chip 209 to an upper bond contact site 205. Similarly, an upper bond contact site 205 can be used to bond an external wire bond 212 to a printed circuit board 210 but preferably to a header 20. Stitch bonds 213 may be made between upper bonding sites 205 of the wafer. All of the interconnections of the system make the wafer into a true monolithic wafer, and when additional or substitute chips are downbonded to the surface of the wafer we consider this a hybrid monolithic wafer system.

As an overview of the system, reference may be had to FIG. 1 in which a complete packaged system is schematically illustrated. Therein a printed circuit board is used to support and interconnect a wafer to the outside world. We prefer to use a header placed between the wafer and a printed circuit board 30. The functions and details thereof are disclosed in copending application Ser. No. 217,146 and referenced as the application entitled Wafer Scale Package System and Header and Method of Manufacture Thereof, by Herbert Stopper and Cornelius C. Perkins. That application has been incorporated in its entirety herewith.

The printed circuit board 30 is the largest part of the system. Interconnecting the board 30 to the monolithic wafer 10 is a header 20. This connects the external board leads 120 to the wafer leads 61. The wafer has a plurality of VLSI die manufactured in accordance with the present state of the art technology. These die are illustrated as 256K ram chips are capable of being manufactured by standard processes on a single wafer. The reticulate interconnection matrix of the type which has been generally earlier described in the previous application U.S. Ser. No. 445,156 is used to interconnect all good die 6 and also to interconnect them to separate processor chips 11 stacked vertically on top the interconnected wafer thereby making up an entire system. In an alternative preferred embodiment, the interconnection matrix can be manufactured alone and all circuits such as chips 11 placed upon the wafer on top thereof making an entire system.

The vertically stacked chips of this system are illustrated as chips 11, which could be processing chips and input/output chips and memory chips and variations thereof, depending upon the requirements of the particular system. The variations on this theme are not described in detail therein, but they will be within the broader scope of our inventions and discoveries because our inventions and discoveries allow the designer to choose the individual features of the system he desires and to achieve it easily by utilizing the wafer which is made by the method of fabrication herein described. Whether it be integrated die 6 or hybrid die 11, the monolithic wafer is integrated by a reticulate matrix of padlines 7 and netlines 8 which are on the order of 10 microns wide and 10 microns thick or thin. These lines cross the wafer between die 6 and/or under the die such as 11 and allow interconnection to a padline within that line at programmable cross points across the major extent of the wafer. These will be described in more detail here especially with respect to the programmable cross point. For bonding points of the chips we have provided pedestals, important features of which are first disclosed herein. The die themselves are interconnected to the reticulate matrix and these bonding pedestals permit reliable interconnection of additional chips in a hybrid fashion by bonding lead lines to pedestals at the appropriate position on the monolithic wafer as well as points for bonding to header 20. The monolithic wafer need not have additional hybrid chips. This adds additional power and flexibility in the making of the system. For instance, the utilization of a 60 chip, 256K ram on the wafer can be utilized to make a fast megabyte scale memory. In order to make a connection of all the netlines and padlines with the header, a rim 74 is provided around the exterior of the wafer. On this rim are primary bonding points 61, secondary bonding points 62, test points 63 and 64 and probe points 64 and 65. There are a pair of test pads 63 and 64 and a set of external lead bonding probe point pads 65 and 66. The function of these probe point pads is to allow a surface interconnection to the header. In addition thereto, at the periphery of the wafer there are ground points 98 and voltage plane points 99 which are disposed at the "corners" of the wafer.

As substantial improvement to the existing wafer, we have utilized and combined separate and distinct inventions or discoveries. We have utilized a wafer wide dielectric capacitor which has been manufactured by a method which consistently permits reproduction on a 100 mm wafer without shorts. The structure in making it will be described with respect to the wafer in this application. A 100 millimeter silicon wafer capacitor is employed in our preferred embodiment. The manufacture consistently of such a device on a short free basis in a reproducible way required discovery of a way of making short free wafers of this size. A perplexing problem in the manufacture of wafers has always been pinholes. In a capacitor, two conductors are separated by a dielectric. If there is a hole in the dielectric a short results in ruining the capacitor. Sometimes the shorts are not readily apparent, but as time passes, the short breaks through. In the manufacture of our monolithic wafer, we provide a capacitor for use between sheet ground and power planes. This is an important development alone and one which has permitted us to manufacture a versatile interconnection matrix which will permit the use of ECL, TTL, C-MOS and like varieties of circuit technologies. The use of the wafer wide capacitor between ground and power planes permits the use of ground and power planes which are sheet planes. This minimizes power surges across the wafer. However, in order to enable wire bonding to be done anywhere across the top conductor of the capacitor, the entire surface of the bonding area must be able to support a bond without breaking through the capacitive layer between power and ground. We have accomplished this by the use of the capacitor which is described herein. We have made it possible to successfully build up pedestals through via holes in the top conductor and through the dielectric as will be described, in selected areas, to minimize the problem of downbonding through deep via holes. A 100% bondable wafer has been achieved only after we learned how to make pinhole-free wafers. To our knowledge, consistent production of very high yield or 100% yield pinhole-free devices has not been accomplished by others. There is no known commercial device which has been found available. On the contrary however, the best contemporary industry practice we have been informed achieves approximately one defect per square centimeter, with the more likely number of defects being on the order of 6 defects per square centimeter. In the capacitor device having metal layers separated by a dielectric, as is desired in our monolithic matrix interconnect wafer scale application, just one pinhole causes a short which can make the wafer useless.

In order to make a pinhole-free dielectric for a capacitor, we utilize a plurality of depositions of silicon salts such as silicon dioxide. The base silicon wafer is coated, as by sputtering, with a metal layer, such as aluminum. Thereafter, a first layer of silicon dioxide is deposited, as by chemical vapor deposition. The first layer is made approximately 0.5 microns. The silicon film dielectric silicon (which could be nitride or amorphous silicon) in an alternate embodiment described below is then nitrogen spray blasted with a jet of compressed nitrogen from a nozzle in a swift cleaning action. The step of deposition of the first layer is repeated, the nitrogen spray blast is repeated, and then the deposition step is repeated again for a third layer. Preferably at each nitrogen step the wafer is rotated 120 degrees. The result consistently has yielded pinhole-free devices between two metal layers to make a short free capacitor.

The ability to make short-free, wafer-wide pinhole-free capacitive layers was thus accomplished when the metal dielectric previously described was coated with a metal layer. However, the ability to make a short-free wafer-wide device which was bondable at any place on an integrated interconnection matrix wafer was a desire to be accomplished. The power rail distribution system of PCT/US81/01725 published Aug. 5, 1982 under WO82/02640 which is an alternate, but now not preferred, embodiment needed to be altered. This power rail distribution system could not be used to handle a variety of circuit types such as TTL and ECL and other high power consumption devices. Instead of the power rail, we learned that it was possible to use the wafer-wide capacitor that we have developed. We determined to use a sheet power plane separated by the thin dielectric from the ground plane. This gave us added advantages over the power rail system and permitted us to use not only MOS and C-MOS circuits but also ECL and TTL circuits and other circuit technologies in the same system. This sheet system carries adequate current and provides distributed capacitances sufficient to allow the use of the different variety of circuit types.

Another important problem for which we have discovered a solution is the way to eliminate shorts which are caused by the pressures exerted in wirebonding to the top layer conductor of our prior laboratory wafer-wide capacitors. We found that wire bonding tools apply enough pressure even though they utilize ultrasonics for bonding to cause shorts to the previously described dielectric or capacitive layer of the wafer-wide capacitor. While we are not certain of the reason, it was consistently observed that such shorts occurred.

We believe this to be due to the fact that the tool pressure deforms a relatively soft aluminum used as top and bottom layers for the conductor and the pressure bends the silicon dioxide similar to "thin ice" to such extent that it cracks and aluminum extrudes through the crack to short. Whatever the reason, it does fail under pressure and cause shorts.

A discovery which we made resulted in a solution which is a substantial improvement. The solution which we prefer to use and which we discovered was to use a metal alloy called Molybdenum Tantalum (Ta 2.5%, Mo 97.5%) which is deposited on top the lower level aluminum conductor and also sometimes over the dielectric adjacent the next metal layer to the thickness of approximately 3 microns.

It is important to appreciate that "Molytantalum" (MoTa), such as described above, is our preferred solution. Other alternative alloys which may be appropriate materials are molybdenum or chromium or tungsten or alloys thereof with tantalum, which have similar properties such as high molecular weight and are capable of absorbing stress and strain in the configuration without substantial deformation. Interestingly, normal metallurgical manuals do not give appropriate value for either hardness or conductivity of sputtered metals. Therefore speculation based upon normal or bulk metalurgical properties is not adequate. Experimentation and/or discovery of unexpected properties is necessary.

In general, we found that two solutions were preferred. The first solution was to place a base conductor covered by a separate metal layer which could stand and absorb the stress and strain of bonding without substantial deformation, preferably Molytantalum, and then cover that with the dielectric layer previously described, and then cover the dielectric layer with another metal layer.

The next preferred step is to deposit a short free capacitor. We prefer to employ the materials previously described. In order to increase uniformity of flaw-free insulation in the form of silicon dioxide or silicon nitride between the two capacitive layers, we have found that it is desirable to deposit these materials in three steps. Each step includes a chemical vapor deposition of either the same element or a related element. As a preferred example we use silicon dioxide three times each with a thickness of 0.5 micron. After 0.5 micron is deposited by the use of a nitrogen gas jet blast, the surface which has been deposited is brushed to free it from particles, the wafer is then rotated, approximately 120 degrees, and the next deposition of 0.5 micron is deposited, thereafter the nitrogen jet brushes the newly deposited surface and a third layer is deposited.

In order to enhance the flaw-free insulator, it may, at times, be desirable to use two or three different materials in the layers as alternating materials. An alternate embodiment here is the use of the deposition of silicon dioxide as a first step, and an intermediary step a layer of amorphous silicon and a third layer of silicon nitride. Alternatively, one could use silicon dioxide then silicon nitride then silicon dioxide. The order is not critical. In order to improve processing time, we have preferred to use one gas mixture and have chosen silicon dioxide as the most desirable gas mixture. Its use is quite effective, and preferred for its properties as well as for a substantial reduction of equipment cost and processing time.

The next step which is preferred is to deposit a ground plane, preferably of a metal aluminum, but alternately a three micron layer of molytantalum, as described above, followed by aluminum.

Figure 16:
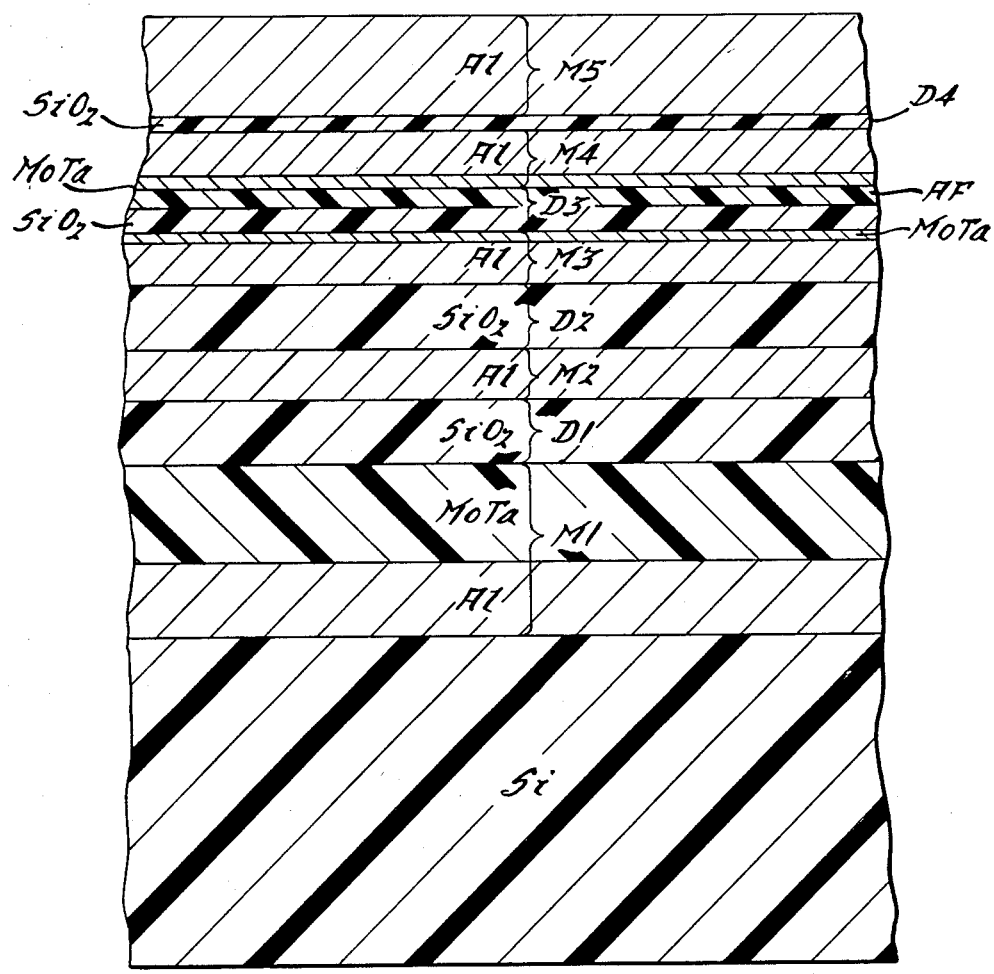
FIG. 16 shows the preferred wafer as a section showing a hybrid interconnection layup.

Turning now more generally to the wafer of FIG. 1 and 16 itself, it is believed the reader will more fully understand the device by reference to the sequential method of making it. FIG. 16 shows our preferred solution to the bonding problem, but details of the masking and etching to achieve the circuit configuration are not there shown. Reference should be made to other figures.

The base layer of the substrate is a silicon wafer. The preferred silicon wafer is a standard 100 mm wafer utilized in the semi-conductor industry. Silicon is chosen for mechanical strength, and we do not have a preference as to whether it is conductive or non-conductive. A characteristic of the wafer, however, is the requirement that it be flat and smooth. It has to be fairly free of flaws and no big spikes should occur as a defect. Crystal defects, however, are not as critical and the important thing is the flatness of the wafer. The size of the preferred wafer is chosen based upon selection from commercial sizes which optimizes the electrical characteristics of the interconnection matrix.

The next layer, or as we will describe this process from the bottom up, the first metal layer M1, is deposited. The first metal layer is a metal which is a good conductor. Gold could be utilized, however, we prefer to utilize aluminum, preferably aluminum with some copper in the range of 0.5 to 4% copper and preferably 1% copper which we found enhances speed of deposition and minimizes spikes. This first layer of metal is used as a ground plane and the ground plane's thickness requirement is related to the voltage drop of the wafer itself. Our preferred range of M1 is between 1.5 microns to 5 microns and preferably 2 microns. It should be noticed that while we could in an alternative embodiment use a pair of equal thickness voltage and ground planes, we have discovered that in order to provide wafers suitable for TTL logic, in view of the sheet resistance, in order to have less voltage drop in the aluminum, the aluminum should be something greater than 1.8 microns and preferably 2 microns, coated by 3 microns of MoTa.

Because of the swing margins of TTL logic and its on/off margins which are no man's land values that are much closer to ground potential than they are to the voltage supply of potential, we have obtained by our structure better results with a non-equal thickness of voltage and ground plane. Accordingly, we have less drop at our voltage plane than in the ground plane delivered to all chips on the wafer and the noise margin we have left for communication from one chip on one side of the wafer to another chip on the other side of the wafer or from the center to the outside, whichever way the signal is to go is better. Because of noise margin, it is important to have the aluminum in the 2 micron aluminum range for the ground plane, rather than a symmetrical configuration. We prefer the thickness of the aluminum to be 1.8 microns upwardly to about 5 microns of aluminum overall, but our solution to the downbonding problem requires a layer of a hard and stress-resistant metal and the use of molytantalum in the range of point 0.25 to 3.5 microns and preferably 3 microns of thickness over the ground plane is a solution which maintains proper noise control and prevents cracking. Aluminum metal thicknesses lower than 1.8 microns are found experimentally to be too brittle and cause occasional cracks. The next metal layer is a three micron layer of molytantalum with 2.5% tantalum. Pure molybdenum is more conductive than molytantalum. As the amount of tantalum concentration increases, the conductivity drops substantially. We utilize the molytantalum as a conductor vertically through to the aluminum and this has not caused substantial interference with the use of the ground plane. The ground plane is then scrubbed.

The next layer D1 is a silicon dielectric layer, as previously described. Preferably, the silicon dioxide is undoped, but some impurities, or some doping, is permitted.

We have chosen to use an alternative embodiment of 2 microns as the thickness for silicon dioxide which are deposited in equal layers as previously described. Preferably, it would be smaller in the range of 1.5 microns so as to increase the capacitance between the voltage plane and the ground plane.

The next layer is a metal layer M2 which is a layer of aluminum of which is in the range of 1 micron to 5 microns and preferably a thickness of 1.5 microns of straight aluminum.

Before this aluminum layer it is possible to add an additional coating of molytantalum, but as this is only an alternative embodiment, which our experimental results have not required us to use. This step can be eliminated as it is our unpreferred embodiment. The capacitance of this layer of M1, D1 and M2 is important in that it enables us to use bypass capacitors. It is possible to use other circuits which are more or less sensitive to noise than to voltage and which do not require the use of bypass capacitors in which instance in an alternative embodiment we would not feel that the capacitance of the capacitor layer is as important as it is in our preferred embodiment. Capacitance is especially important with TTL logic and the upper-word range of the thickness of the capacitor is 2 microns. It is preferably lower. We choose to use the upper end of the range in order to reduce the "thin ice" problem and eliminate the MoTa layer on M2. You must consider that the bulk of TTL parts have voltage and ground which are approximately in the center of the chip. The chip fits on approximately a 4,500 micron square area. Our bonding pads are at the side of the chip. This means that one has to have a 300 micron-long run running the voltage to the voltage pads on the chip. It does not mean that the TTL chips have to be designed as they are, in fact, it is conveniently possible to bring the pads out from the center.

Returning to the manufacture of the wafer itself, the second metal layer M2 is the sheet voltage layer in our preferred embodiment. It is the one that is on top of the capacitive layer which has been previously described as being deposited. Again, in our preferred embodiment, we deposit only 1.5 microns of aluminum as a second layer. As an alternative preferred embodiment, first is deposited 0.3 microns of molytantalum and then 1.5 microns of aluminum. The advantage of the molytantalum thin layer is that it does make it tough and more difficult to break from the outside and to use a thinner D1 layer, but this advantage also incorporates a disadvantage in that the etching of metal layers which have two dissimilar metals is difficult, and since the second metal layer is etched, this molytantalum barrier layer has been eliminated. The second metal layer M2 is a conductive layer used as the voltage plane. The second metal layer is masked, etched and stripped and the capacitor tested before further processing.

On top of the voltage plane is then deposited a 2 micron thick insulator D2. The insulator may be thicker but it is preferably 2 microns, or even slightly greater. The range would be 1 micron to 2.5 microns with 2 microns being chosen as the best compromise between a low capacitance and the ability to etch holes in the layer and to minimize the time it takes to prepare it. It takes considerable time by chemical vapor deposition to build up a layer of insulator. The insulator is preferably silicon dioxide but could be silicon nitride. The linear capacitances along the line of the next metal layer which is a signal line make it desirable to minimize the capacitance between the voltage plane and the signal plane. This decreases signal delay.

The next layer is a metal layer M3, the third metal layer and is the layer used to make the external contacts to the outside world, as seen in FIG. 12. This metal layer is 1 micron of aluminum thick and runs across the whole surface until it is etched. This is the first interconnection layer that is used primarily for signal runs going from east to west or horizontally in the FIG. 1. On the top of this signal layer of aluminum, we deposit a thin coating of molytantalum. We have learned that molytantalum functions well as a barrier layer between aluminum and the next layer which is a composite amorphous silicon layer which will be described in detail. This is a very thin coating of molytantalum and the range is between 0.1 microns and 0.2 microns with the preferential thickness being 0.15 microns. 0.15 microns of molytantalum (97.5% Mo 2.5% Ta) is used as satisfactory intermediate between the desirability of the thin layer to reduce problems of etching dual metal layers adequate thickness to act as a barrier layer. The barrier metal should be at least 0.1 microns in thickness. If etching of dual metal layers can be improved, it may be possible to make this metal layer slightly thicker. The next layer, another insulator layer, is the composite insulator. It is composed of a first layer D3 of 0.5 microns to 1 microns and preferably 0.6 microns thick of silicon dioxide which is followed by an amorphous silicon layer. D3 is masked, etched and stripped before amorphous silicon is added.

The amorphous silicon part of this composite dielectric we have discovered can be improved by making it a composite layer, even though in an alternative embodiment amorphous silicon can be used. A triple layer of amorphous silicon is our preferred embodiment. While it is possible to use say 0.25 microns of undoped amorphous silicon above 1 micron of silicon dioxide we have found that there is a great improvement in etching and performance can be made by making the silicon dioxide layer D3 a 0.6 micron layer with very tiny holes in it and this is coated on top with an amorphous silicon layer AF of 0.25 microns of hydrogen doped amorphous silicon, then with 0.22 microns of undoped amorphous silicon, and then this is coated with 0.24 microns of doped amorphous silicon. The range of each of those layers is 0.2 microns to 0.3 microns.

The amorphous silicon layer is then masked for D1/D2, etched, stripped, masked, etched and stripped before the last or top interconnect metal layer M4 is deposited. M4 consists of 0.15 microns of molytantalum on top of the AF layer as a barrier metal followed by one micron of aluminum. M4 is masked, etched and stripped. This layer in general is used for vertical or north-south interconnections. There are intermediate tests possible at this time.

On top of M4 there is deposited another dielectric layer of silicon dioxide D4 which is a passivation layer, preferably 0.5 microns in thickness. This is then masked, etched and stripped before depositing the last pedestal metal layer M5. D4 stops etching of the M5 layer and prevents the etchant from etching either M4 or M3, acting as a barrier.

The last pedestal metal layer is a 3 micron layer of aluminum (all aluminum can be deposited with the same aluminum 1% copper target). This pedestal level raises bonding points so the bonding tool will strike a location at a bonding site above anything else.

The inventions and discoveries claimed herein have been described in various examples. The combinations claimed include the specific examples, and combinations of specific examples and combinations of parts of the specific examples. After a review of this description, those skilled in the art, both now and in the future, will envision modifications and alterations which may be equivalents of the inventions and improvements and their combinations claimed. Such modifications should be deemed to be within the scope of the claims when utilizing the inventive nature of our inventions. This is a new technology, and it is believed this disclosure extends beyond what was possible before our disclosure.

What is claimed is:

1. A substrate for interconnecting a plurality of integrated circuits:
    a base wafer;
    a first power plane deposited on said base wafer;
    a thin dielectric plane deposited on said first power plane layer;
    a second power plane deposited on said dielectric plane layer;
    said first power plane, said dielectric plane and said second power plane forming a wafer wide power plane capacitor across the surface of said wafer in which one of said first and second power planes provides a voltage plane and the other of said first and second power planes provides a ground plane;
    one of said power planes being more electrically resistive than the other of said power planes, and the thickness of said dielectric layer being smaller than at least one of said power planes to increase the capacitance between said power planes; and
    a multi-layer interconnection network of conductive signal lines disposed on said wafer wide power plane capacitor for interconnecting a plurality of integrated circuits.

2. The substrate according to claim 1 wherein said first power plane includes two metallic layers, in which one of said metallic layers is harder than the other of said metallic layers.

3. The substrate according to claim 2 wherein one of said metallic layers includes aluminum and the other of said metallic layers includes a molybdenum tantalum alloy.

4. The substrate according to claim 1 wherein said dielectric plane includes a plurality of dielectric layers.

5. The substrate according to claim 4 wherein at least two of said dielectric layers are deposited across different directions of said base wafer.

6. The substrate according to claim 1 wherein said base wafer is silicon.

7. The substrate according to claim 1 wherein said multi-layer interconnection network of conductive signal lines is electrically programmable for interconnecting said plurality of integrated circuits.

8. A capacitive device formed on a wafer comprising,
    a first metal base layer,
    a second metal layer,
    and a dielectric layer formed between the said first and second metal layers, said dielectric layer being formed on said base layer in a plurality of successive silicon dielectric depositions to form a single composite layer, each said deposition being separately deposited across different directions of said wafer to avoid pinholes in the composite.

9. An antifuse device for an electrical circuit comprising, a first metal conductor, and a second metal conductor, and an antifuse layer between said conductors which is normally a dielectric but which in response to an electrical potential forms an electrically conducting path from said first conductor to said second conductor, said antifuse layer comprising a composite sandwich layer including a first doped amorphous silicon layer, a second undoped amorphous silicon layer and a third doped amorphous silicon layer.

10. An antifuse device according to claim 9 wherein said doped layers are hydrogen doped.

11. An antifuse device according to claim 9 wherein said device includes an additional dielectric layer chosen from the group consisting of silicon salts including silicon dioxide, silicon nitride and silicon.

12. An antifuse device according to claim 9 wherein said doped amorphous silicon layer is deposited having a thickness in the range of 0.2 to 0.3 microns and said undoped amorphous silicon is a deposit having a thickness in the range of 0.2 to 0.3 microns.

13. A device according to claim 9 wherein said metal conductors include MoTa.

14. A device according to claim 9 wherein said second metal conductor is formed of a first metal layer which includes aluminum and a second metal layer which includes molybdenum tantalum metal which includes molybdenum, tantalum, chromium, tungsten and mixtures and alloys thereof.

15. A substrate for interconnecting a plurality of integrated circuits:

a base wafer;

a first power plane deposited on said base wafer;

a dielectric plane deposited on said first power plane layer, said dielectric plane including a plurality of dielectric layers, in which at least two of said dielectric layers are deposited across different directions of said base wafer;

a second power plane deposited on said dielectric layer;

said first power plane, said dielectric plane and said second power plane forming a wafer wide power plane capacitor in which one of said first and second power planes provides a voltage plane and the other of said first and second power planes provides a ground plane; and a multi-layer interconnection network of conductive signal lines deposited on said wafer wide power plane capacitor for interconnecting a plurality of integrated circuits.

16. The substrate according to claim 15 wherein said multi-layer interconnection network of conductive signal lines is electrically programmable for interconnecting said plurality of integrated circuits.

* * * * *

UNITED STATES PATENT AND TRADEMARK OFFICE
CERTIFICATE OF CORRECTION

PATENT NO. : 4,847,732
DATED : July 11, 1989
INVENTOR(S) : Herbert Stopper and Cornelius C. Perkins It is certified that error appears in the above-identified patent and that said Letters Patent is hereby corrected as shown below:

In References Cited, Chance et al., "6/1985" should be --6/1984--.

Column 2, line 19, after "this" insert the following: --problem Trilogy's wafers plan to be die-attached to a molybdenum substrate with a thick layer of solder for stress accommodation. The molybdenum substrate was known to provide a friendly expansion coefficient with high thermal conductivity. The backside of the substrate was then to be water cooled. The reason for Trilogy's failure to bring the product to market is unknown.

There is commercially available today from IBM something called a thermal conduction module which is utilized to package memory and other electronic devices. It is understood that the commercial module is called TCM XX-33. This module is utilized for commercial applications and is far more complicated than the present device, but generally

UNITED STATES PATENT AND TRADEMARK OFFICE
CERTIFICATE OF CORRECTION

PATENT NO. : 4,847,732
DATED : July 11, 1989
INVENTOR(S) : Herbert Stopper and Cornelius C. Perkins It is certified that error appears in the above-identified patent and that said Letters Patent is hereby corrected as shown below:

described in Electronics, June 16, 1982. Systems made, which utilize the device described herein, are expected to improve the cost performance over competitive systems.

SUMMARY OF THE INVENTION

Our technology preferably utilizes electrical programming of chip or integrated circuit interconnections. In the prior application we disclosed--.

Column 7, line 35, after "chips" insert --and--.

Column 14, line 22 before "layer" delete --plane--.

Signed and Sealed this

Twenty-fifth Day of September, 1990

Attest:

HARRY F. MANBECK, JR.

*Attesting Officer*     *Commissioner of Patents and Trademarks*